United States Patent [19]

Yamazaki

[11] 4,442,338

[45] Apr. 10, 1984

[54] PLASMA ETCHING APPARATUS

[75] Inventor: Takashi Yamazaki, Kawasaki, Japan

[73] Assignee: Tokyo Shibaura Denki Kabushiki Kaisha, Kawasaki, Japan

[21] Appl. No.: 296,305

[22] Filed: Aug. 26, 1981

[30] Foreign Application Priority Data

Sep. 3, 1980 [JP] Japan .................. 55-121007

[51] Int. Cl.³ .......................... B23K 9/00; C23F 1/02
[52] U.S. Cl. ...................... 219/121 PE; 219/121 PG; 204/192 E; 156/345; 156/646; 422/906
[58] Field of Search ................. 219/121 PD, 121 PE, 219/121 PG; 204/192 E, 164, 192 EC; 156/643, 646, 345; 427/38, 309; 422/906, 188

[56] References Cited

U.S. PATENT DOCUMENTS

| | | | |
|---|---|---|---|
| 4,057,460 | 11/1977 | Saxena et al. | 156/646 |
| 4,183,781 | 1/1980 | Eldridge et al. | 156/646 |
| 4,252,595 | 2/1981 | Yamamoto et al. | 156/646 |
| 4,321,104 | 3/1982 | Hasegawa et al. | 156/646 |
| 4,335,506 | 6/1982 | Chiu et al. | 156/643 |

Primary Examiner—M. H. Paschall
Attorney, Agent, or Firm—Oblon, Fisher, Spivak, McClelland & Maier

[57] ABSTRACT

Disclosed is a plasma etching apparatus in which an etching chamber accomodates a pair of parallel flat plate electrodes facing each other. The etching chamber is also provided with a device for applying high frequency power to one of the electrodes and a system for introducing a reactive gas. An after-treatment chamber is connected to the etching chamber and provided with a system for introducing a heated gas into the interior, a partition means for hermetically partitioning the etching chamber and after-treatment chamber, and a system for transporting the workpiece in the etching chamber into the after-treatment chamber.

4 Claims, 2 Drawing Figures

PLASMA ETCHING APPARATUS

BACKGROUND OF THE INVENTION

This invention relates to plasma etching and, more particularly, to apparatus for and process of plasma etching.

With recent trend for increasing integration density, more and more LSIs (large scale integrated circuit) are being replaced with VLSIs (very large scale integrated circuit), and this is requiring the replacement of wet etching process with dry etching process in the manufacture of such semiconductor devices. Particularly, reactive ion etching has been extensively used as the dry etching process. In the reactive ion etching process, reactive gas is introduced into a space between a pair of flat plate electrodes disposed parallel to and facing each other, and is dissociated through discharge caused by application of high frequency power to one of the electrodes, thus producing plasma. Positive ions in the plasma thus produced are accelerated by a negative self-bias generated on the workpiece and caused to bombard the workpiece, which is placed on the electrode to which the high frequency power is applied. In this way, the etching of the workpiece is effected. Highly precise patterns can be formed by the reactive ion etching using, for instance, such gases as $CHF_3$ and a gas mixture of $CF_4$ and $H_2$ in such case as when forming contact holes in a $SiO_2$ film formed on a semiconductor substrate. High precision etching of polycrystalline silicon used as the electrode material can be obtained by using such gases as $CBrF_3$ and a gas mixture of $CBrF_3$ and $Cl_2$. Further, such gases as $CCl_4$ and a gas mixture of $CCl_4$ and $Cl_2$ can be used for the high precision etching of Al and Al alloys serving as the interconnection electrode material.

Among the aforementioned combinations of reactive gases and workpiece materials, particularly chlorine-containing gases used for etching Al or Al alloys, unlike the other combinations, present many problems because of the very strong corrosive action upon the Al and Al alloys and the difficulty of removing the oxide film ($Al_2O_3$) on the Al or Al alloy surface. For example, the reproducibility of etching is inferior due to a delay time involved at the commencement of etching. Also, undesired residue results from the etching. Further, after the workpiece material is taken out to the atmosphere, corrosion of Al or Al alloy is observed.

Among these problems, the reproducibility has been found to be extremely improved, as a result of research and investigations by the inventors, by using a mixture of $CCl_4$ and $Cl_2$ as the reactive gas and minimizing the effects of $H_2O$ on the etching. However, the problem of the corrosion of the workpiece material has not yet been solved. This corrosion is thought to be caused by HCl generated as a result of hydrolysis of $Cl_2$ occurring when the workpiece material is taken out from the etching chamber to the atmosphere after the etching. There is a well-known method of preventing such corrosion of the workpiece material, in which the process material is not taken out to the atmosphere immediately after the etching but is exposed to $O_2$ plasma in the same etching chamber, thus covering the processed surface with oxide. With this method, however, the process with $O_2$ plasma in the etching chamber is greatly influenced by $Cl_2$ remaining in the etching chamber, and therefore the prevention of the corrosion of the workpiece material is insufficient. In addition, $O_2$ plasma is liable to cause damage to an organic film coated on the electrodes and etching chamber inner walls.

The corrosion of the workpiece material often gives rise to such problems as extreme difficulty of the subsequent removal of resist, defective isolation in the patterning of interconnection electrodes and reduction of the reliability of elements due to $Cl_2$ remaining on the workpiece material surfaces.

SUMMARY OF THE INVENTION

An object of the invention is to provide an apparatus for and a process of plasma etching, which can prevent the corrosion of the workpiece, thus permitting the manufacture of a highly reliable semiconductor device.

According to the invention, there is provided a plasma etching apparatus comprising an etching chamber accommodating a pair of parallel flat plate electrodes facing each other and provided with means for applying high frequency power to one of the electrodes and means for introducing a reactive gas, an after-treatment chamber connected to the etching chamber and provided with means for introducing a heated gas into the interior, partition means for hermetically partitioning the etching chamber and after-treatment chamber, and means for transporting the workpiece in the etching chamber into the after-treatment chamber.

According to the invention, there is also provided a plasma etching process comprising a step of exposing the workpiece to plasma of a reactive gas introduced into a space between a pair of parallel flat plate electrodes disposed in an etching chamber, said plasma being formed by applying high frequency power to one of the flat plate electrodes, a step of removing the workpiece from the etching chamber and a step of treating the workpiece with a flowing heated gas.

DETAILED DESCRIPTION OF THE PREFERRED EMBODIMENT

In the plasma etching porcess according to the invention, after the workpiece is etched in an etching chamber by plasma etching using a reactive gas containing chlorine atoms, the processed workpiece is transported into an after-treatment chamber, the internal atmosphere of which is being heated, and thermally treated there by introducing a gas heated to 40° to 200° C., thereby removing Cl remaining on the workpiece surface. The heat treatment with the heated gas may be done while exhausting the heated gas from the after-treatment chamber. As the heated gas, there may be used inert gases such as Ar, He and Ne and also such gases as $O_2$, $N_2$, $H_2$, etc. Gas mixture of these gases also may be used.

As the chlorine-containing reactive gas, there may be used $CCl_4$, $BCl_3$, $SiCl_4$ and a gas mixture of $CCl_4$ and $CL_2$. The plasma etching according to the invention has particularly pronounced effects when applied to the etching of Al or Al alloys as material to be etched.

With the plasma etching according to the invention, the corrosion of the processed material, which has hitherto been a significant problem, can be solved. In addition, the removal of resist after the etching can be readily made, and also reliable isolation can be obtained in the patterning of interconnection electrodes. Thus, manufacture of highly reliable elements is possible.

Now, the construction and operation of an embodiment of the plasma etching apparatus according to the invention will be described.

Figure 1:
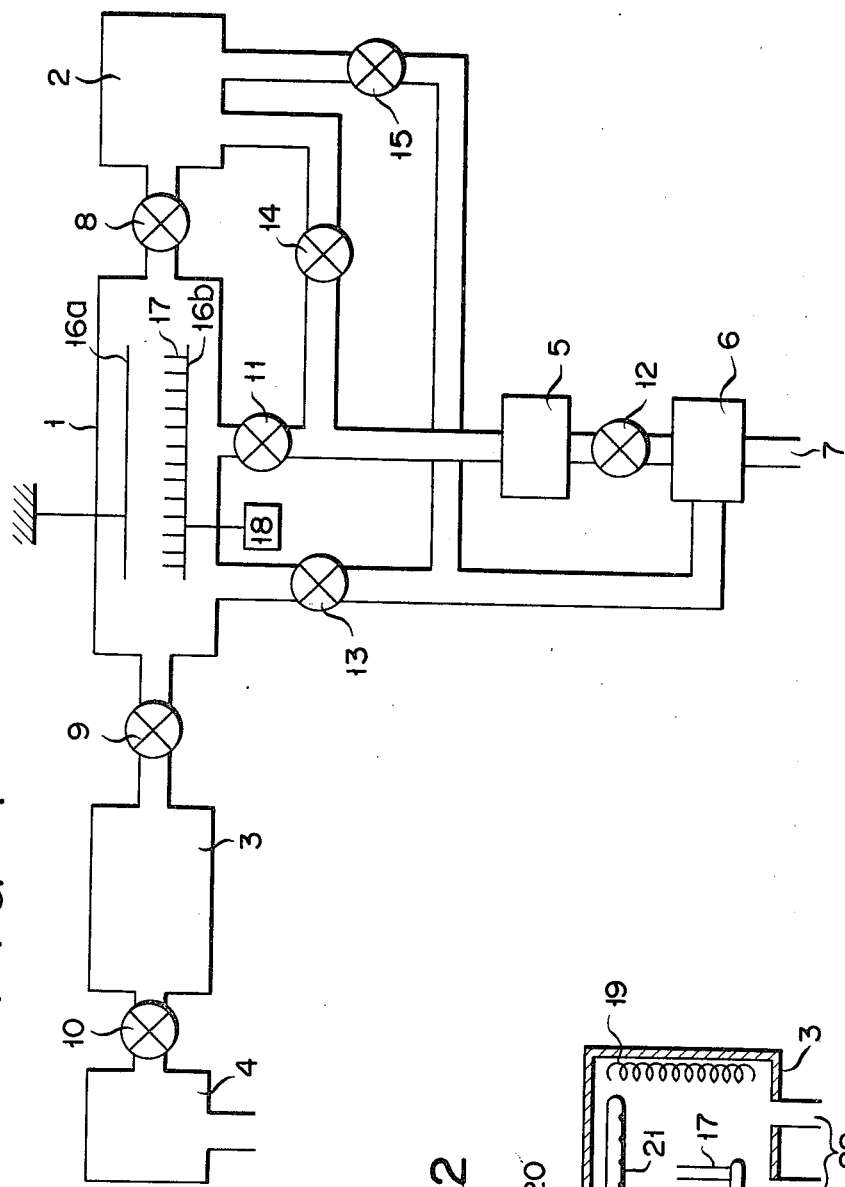
FIG. 1 is a diagrammatic view of an embodiment of the plasma etching apparatus according to the invention.

Referring now to FIG. 1, an etching chamber 1 is connected via a valve 8 to a feeding chamber 2 and is also connected via a valve 9 to an after-treatment chamber 3, which is in turn connected via a valve 10 to a receiving chamber 4. The etching chamber 1 is evacuated by a rotary pump 5 and a diffusion pump 6, and the outlet of the diffusion pump 6 is open to the atmosphere. A conduit connecting the etching chamber 1 and rotary pump 5 is provided with a valve 11, a conduit connecting the rotary pump 5 and diffusion pump 6 is provided with a valve 12, and a conduit connecting the etching chamber 1 and diffusion pump 6 is provided with a valve 13. Further, a valve 14 is provided on a conduit connecting the feeding chamber 2 and an outlet side conduit of the valve 11, and a valve 15 is provided on a conduit connecting the feeding chamber 2 and an outlet side conduit of the valve 13.

Inside the etching chamber 1, a pair of parallel flat plate electrodes 16a, 16b are disposed. A workpiece 17 is placed on the lower electrode 16b, which is connected to a high frequency power generator 18.

Figure 2:
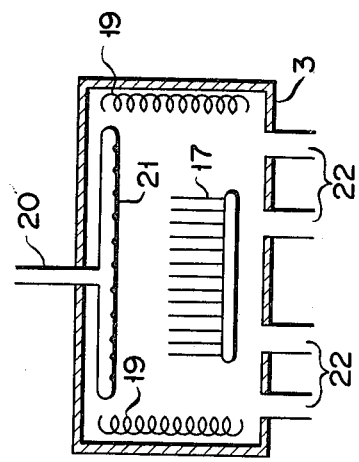
FIG. 2 is a fragmentary sectional view showing an after-treatment chamber of the plasma etching apparatus shown in FIG. 1.

FIG. 2 is a sectional view showing the construction of the after-treatment chamber 3. A heater 19 is disposed in the vicinity of the inner wall of the after-treatment chamber 3. The ceiling of the after-treatment chamber 3 is provided with a heated gas supply conduit 20, which is provided at its end extending in the chamber 3 with a distributor 21. In the chamber 3, the workpiece 17 is disposed below the distributor 21. The chamber 3 is further provided with exhaust ports 22, through which the heated gas is exhausted.

The operation of the plasma etching apparatus described above will now be described. First, the workpiece is transported into the feeding chamber 2 with the valves 8, 14 and 15 held closed. Then, the valve 15 is opened for auxiliary exhausting. Subsequently, the valve 8 is opened, and the workpiece is transported from the feeding chamber 2 into the etching chamber 1 with a transporting means (not shown) and is placed on one of the pair parallel flat electrodes 16a, 16b. Thereafter, the valve 8 is closed while the valve 11 is opened, thereby evacuating the etching chamber 1 to a high vacuum ($10^{-5}$ Torr or below). Then, a gas mixture of $CCl_4$ and $Cl_2$ is introduced into the etching chamber, and high frequency power is applied to the electrode 16b to produce gas plasma for reactive ion etching the workpiece surface.

In the prior art process, after the etching is ended, the workpiece 17 is returned from the etching chamber 1 to the feeding chamber 2 by opening the valve 8 and exposed to atmosphere immediately afterwards. In the process according to the invention, after the end of the etching, the valve 9 is opened and the workpiece 17 is transported into the after-treatment chamber 3, the inside of which is heated by the heater 19. Then, the valve 9 is closed, and the workpiece 17 is thermally treated by introducing $N_2$ gas heated to 40° to 200° C. through the conduit 20 such that it contacts the workpiece 17. The heated $N_2$ gas is immediately exhausted from the after-treatment chamber 3 to the outside. The gas pressure in the after-treatment chamber 3 is, for instance, atmospheric pressure. Alternatively, it may be lower than, or higher than, atmospheric pressure. After the thermal treatment, the workpiece 17 is transported to the receiving chamber 4 and recovered.

As the transport means for transporting the workpiece between adjacent chambers may be used a belt conveyor.

As has been described in the foregoing, in the plasma etching process according to the invention, the workpiece having undergone etching is thermally treated in the after-treatment chamber by non-dissociated gas at a comparatively low temperature of 40° to 200° C. Thus, the workpiece can be sufficiently deprived of Cl without the possibility of being damaged, and the problem of the corrosion of the workpiece is eliminated.

In the above-mentioned embodiment the workpiece is transported to the after-treatment chamber 3 right after the etching and is then undergoes the heat treatment in the chamber 3. Instead, the workpiece may be taken out into the atmosphere after the etching and may then be put into the chamber 3. The experiment wherein a gas mixture of $CCl_4$ and $Cl_2$ was used as reactive gas proved that the workpiece was not affected if it had been take out of the etching chamber and left to stand in the atmosphere, as long as it was left in the atmosphere not longer than 30 seconds.

What is claimed as new and desired to be secured by Letters Patent of the United States is:

1. A plasma etching process comprising:

etching by exposing a workpiece containing aluminum or aluminum alloy in its surface to plasma of a reactive gas introduced into a space between a pair of parallel flat plate electrodes disposed in an etching chamber, said plasma being formed by applying high frequency power to one of said flat plate electrodes, said reactive gas containing chlorine atoms and the other electrode being grounded;

transporting the workpiece from said etching chamber into an after-treatment chamber; and blowing a gas heated to 40° to 200° C. introduced through a conduit against the workpiece in the after-treatment chamber so as to remove chlorine remaining on the workpiece surface.

2. The process according to claim 1, wherein said gas containing chlorine atoms is one selected from the group consisting of $CCl_4$, $BCl_3$, $SiCl_4$, and a gas mixture of $CCl_4$ and $Cl_2$.

3. The process according to claim 2, wherein the workpiece material to be etched is aluminum or an aluminum alloy.

4. The process according to one of claims 1 to 3, wherein said heated gas consists of one or more members of a group consisting of Ar, He, Ne, $N_2$, $O_2$ and $H_2$.

* * * * *